United States Patent [19]
Tamanuki et al.

[11] Patent Number: 6,075,801
[45] Date of Patent: *Jun. 13, 2000

[54] SEMICONDUCTOR LASER WITH WIDE SIDE OF TAPERED LIGHT GAIN REGION

[75] Inventors: Takemasa Tamanuki; Hiroyuki Yamazaki, both of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/587,913

[22] Filed: Jan. 17, 1996

[30] Foreign Application Priority Data

| Jan. 18, 1995 | [JP] | Japan | 7-005875 |
| Jul. 13, 1995 | [JP] | Japan | 7-199288 |

[51] Int. Cl.$^7$ .................................................. H01S 3/085
[52] U.S. Cl. ................................ 372/46; 372/45; 372/50; 372/704
[58] Field of Search ........................... 372/44, 50, 92, 372/46, 45, 704; 385/14

[56] References Cited

U.S. PATENT DOCUMENTS

| 4,369,513 | 1/1983 | Umeda et al. | 372/50 |
| 4,709,371 | 11/1987 | West | 372/44 |
| 5,078,516 | 1/1992 | Kapon et al. | 385/14 |
| 5,202,285 | 4/1993 | Sugano et al. | 372/46 |
| 5,517,517 | 5/1996 | Liou | 372/50 |
| 5,644,586 | 7/1997 | Kawano et al. | 372/50 |

FOREIGN PATENT DOCUMENTS

| 57-69793 | 4/1982 | Japan | 372/45 |
| 3-16192 | 1/1991 | Japan | 372/46 |
| 3-257888 | 11/1991 | Japan | 372/50 |
| 5-110186 | 4/1993 | Japan | 372/46 |
| 6-283807 | 10/1994 | Japan | 372/50 |

OTHER PUBLICATIONS

Agrawal, Semiconductor Lasers Past, Present and Future, American Institute of Physics, pp. 226–228, 1995.
Yamanaka et al, Super High Power Semiconductor Laser, Laser Studies, 1990, vol. 18, pp. 555–559 (Jun.).
Harnagel et al, High–Power Quasi–CW Monolithic Laser Diode Linear Arrays, Appl. Phys. Lett., 1986, vol. 49, pp. 1418–1419 (Nov.).
Kintzer et al, High–Power, Strained–Layer Amplifiers and Lasers with Tapered Gain Regions, IEEE Photonics Technology Letters, 1993, vol. 5, No. 3, pp. 605–607 (Jun.).
Shigihara et al, High–Power and Fundamental–Mode Oscillating Flared SBA Lasers, Electronics Letters, 1988, vol. 24, No. 18, pp. 1182–1183 (Sep.).
Parke, et al, 2.0 W CW, Diffraction–Limited Operation of a Monolithically Integrated Master Oscillator Power Amplifier, IEEE Photonics Technology Letters, 1993, vol. 5, No. 3, pp. 279–300 (Mar.).

*Primary Examiner*—James W. Davie
*Attorney, Agent, or Firm*—Hayes, Soloway, Hennessey, Grossman & Hage, PC

[57] ABSTRACT

The semiconductor laser disclosed includes a first conductivity type buffer layer, an active layer and a second conductivity type cladding layer which are sequentially positioned on a first conductivity type semiconductor substrate. The active layer has a laser gain region to which an electric current is injected. The laser gain region having a width varying linearly along a resonating direction is disposed between a high reflection film provided on a facet of a wide side of the laser gain region of the active layer and a low reflection film provided on a facet of a narrow side of the laser gain region of the active layer. The facet of the narrow side is for outputting oscillation beams of a high order mode. This provides a high electrical-to-optical conversion efficiency, and enables the outputting of a large output from a narrow light emission region.

5 Claims, 13 Drawing Sheets

FIG. 2 PRIOR ART
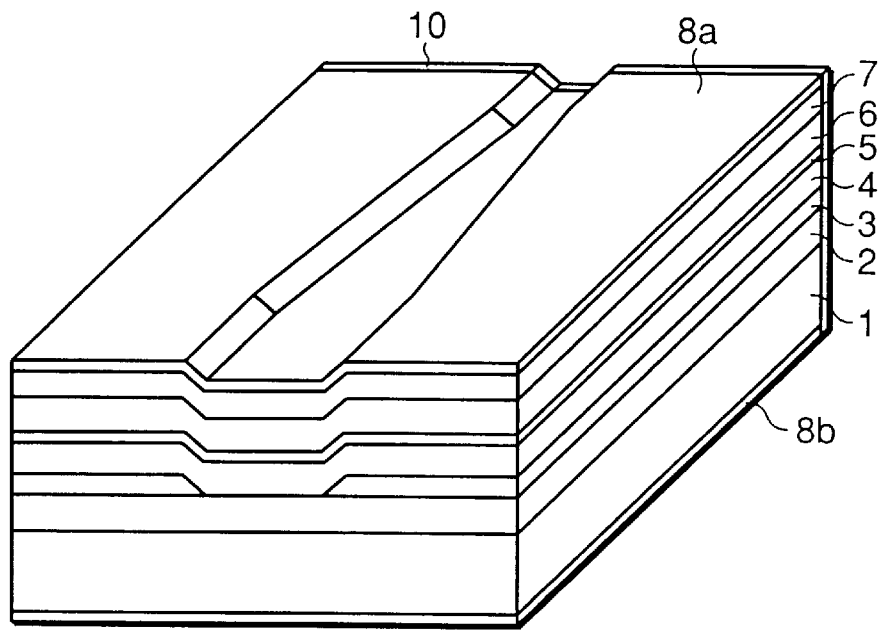
FIG. 3 PRIOR ART
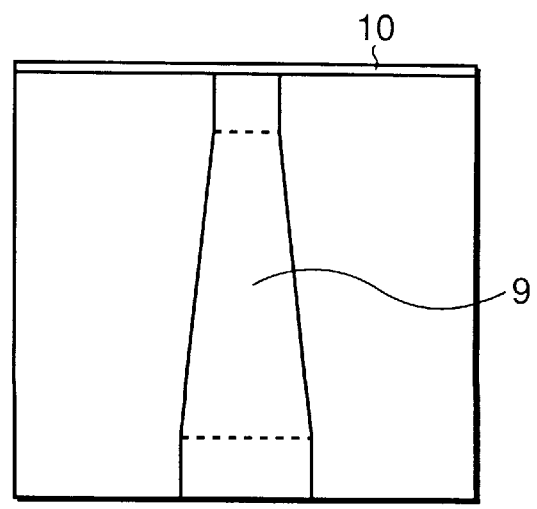

SEMICONDUCTOR LASER WITH WIDE SIDE OF TAPERED LIGHT GAIN REGION

BACKGROUND OF THE INVENTION (1) Field of the Invention

The present invention relates to a semiconductor laser adapted to be used as a light source for optical measuring and solid-state laser excitation, and is capable of operating with a large output of up to several tens of Watts, and more particularly to a semiconductor laser and a composite semiconductor laser in which a large output can be obtained with a narrow optical output region.

(2) Description of the Related Art

In the field of, for example, optical measuring, a device for measuring distance to a given point has been developed. For such a device, there is a need for a high output laser diode as a light source which generates an optical output in the Watt and several tens of Watts classes.

For showing structural differences in the semiconductor laser according to the invention as compared with prior art semiconductor lasers, FIG. 1A shows the general structural arrangements of a laser outputting elements according to the invention and FIGS. 1B–1D show those of prior art examples.

In FIGS. 1A–1C, the numeral 9 depicts a light gain region, 10 depicts a high reflective film, and 11 depicts a low reflective film.

A first prior art example (FIG. 1B) relates to a high output laser diode which generates an optical output in the Watt class and in which, in a single diode chip, the width of the light emission region is made broader in order to obtain high power. This is called a "broad area laser diode". According to a report by H. Yamanaka, et al, under the title "Super High Power Semiconductor Laser," in Laser Studies, 1990, Volume 18, p. 555, output of 6 W has been obtained in the emission region with 600 μm width. Also, there is a report on a device in which a plurality of laser elements are arranged in an array form, according to a report by Harnagel, et al. Under the title "High-power quasi-cw monolithic laser diode linear arrays", in Appl. Phys. Lett., 1986, Volume 49, p. 1418, with which output larger than 100 W has been obtained in the total emission region with 7200 μm width.

In this first prior art region example (FIG. 1B), the width of the active region is 100 μm, and the length of the action region is 1000 μm.

A second prior art example (FIG. 1C) relates to a laser diode whose active layer width is flared in the direction of a resonator so as to provide stable high power with a fundamental transverse mode up to the Watt class. Such a prior art example, as shown in a perspective view and plan view, respectively, in FIGS. 2 and 3, has been reported by K. Shigihara, et al. under the title "High-power and fundamental-mode oscillating flared SBA lasers," in Electronics Letters, 1988, Volume 24, No. 18, pp. 1182–1183.

In this second prior art example, the width of the active region at the light output side is 100 μm, the width of the active region at the rear facet side is 4 μm and the length of the active region is 1000 μm.

The semiconductor laser of the second prior art example, having a desired flared configuration, is formed through processes wherein a buffer layer 2 and current blocking layer 3 are grown on substrate 1, a part of the current blocking layer 3 is etched and removed such that the width thereof varies in the direction of a resonator and, on the entire surface of the resulting structure, a lower cladding layer 4, an active layer 5, an upper cladding layer 6 and a contact layer 7 are sequentially formed one over another. Then, electrodes 8a and 8b are formed respectively at the epitaxially grown layer side and the substrate side, and a highly reflective film is formed on a facet at a narrow side of the etch-removed portion of the current blocking layer 3. The current is injected only to the etch-removed portion of the current blocking layer 3 so that, as seen in plan view in FIG. 3, the widths of the light emission region 9 vary in the direction in which the light is resonated (thus, flaring in the direction to the light output). By using such an element, 4 W output has been obtained in the light output region with 200 μm width according to a report by E. S. Kintzer, et al. under the title "High-Power, Strained-Layer Amplifiers and Lasers with Tapered Gain Regions" in IEEE Photonics Technology Letters, 1993, Vol. 5, No. 6, pp. 605. In this prior art example, the optical output at the wide region and that at the narrow region are the same as each other.

A third prior art example (FIG. 1D) relates to an arrangement wherein an amplifier is of an integrated Master Oscillator Power Amplifier (MOPA) which is reported, for example, by R. Parke, et al under the title "2.0 W CW, Diffraction-Limited Operation of a Monolithically Integrated Master Oscillator Power Amplifier" in IEEE Photonics Technology Letters, 1993, Vol. 5, No. 3, pp. 279–300. According to the report, output larger than 2 W has been obtained in the light output region with 200 μm width.

In this third prior art example, the width of the active region at the light output side is 100 μm, the width of the active region at the rear facet is 4 μm, and the length of the active region at the amplifier section is 1000 μm. That is, in this example, the laser beams formed at the DFB laser region 16 are amplified at the amplifier region 17 and emitted through an antireflection film 18.

FIG. 4 shows electric current/optical output characteristics of each of the structures shown in FIGS. 1A–1D. Since the reflectivities of the reflective mirrors in the structures of FIGS. 1A–1C are respectively the same, it is assumed that the respective internal losses are also substantially the same and that efficiencies are substantially the same, accordingly. Further, output of light increases along with the injection of current, but there is a limit in the amount of light output since saturation of light output becomes distinct beyond a certain current density. Experimentally, such a current density was estimated as 66 kA/cm$^2$ (the point of the current density 66 kA/cm$^2$ is indicated by the mark V in FIG. 4). Where current density and efficiency are the same, higher output is obtained by the laser with wide light emission region according to the present invention. In actuality, whereas, at the current density 66 kA/cm$^2$ at which saturation of light output begins, the output obtained in the laser according to the present invention is 50 W, the outputs obtained in the prior art examples 1 and 2 are 32 W and 27 W, respectively.

In the amplifier integrated type laser shown in FIG. 1D, the light output is limited by the saturated output at the amplifier section. Here, the reflectivity at the facet was made 0.001% and the maximum injection current was made 4 A. In the semiconductor laser having a configuration of this type, it is difficult to obtain an output larger than 10 W.

From the above, it can be appreciated that, with the flared type semiconductor laser according to the invention, a larger output can be obtained in the narrow light output region as compared with each of the conventional examples explained above.

In the first prior art example, in which it is intended to increase the output by broadening the width of the light output region or by increasing the number of semiconductor lasers through an array arrangement, there is a problem that, since the light emission region is required to be large, the optical system for forming, for example, a measuring device inevitably becomes large.

In the second prior art example which relates to a flared structure type semiconductor laser, the light is outputted from the portion with a wider active region, and output is made large by increasing the width of the light emission region at the portion with a wide active region. Thus, because of mode control, there is a limitation also in widening angle of the light emission region such that, in order to increase output, it is necessary to make the length of the resonator. Such an attempt to increase the output results in the lowering of electric/optical output conversion efficiency. Therefore, a problem in the second prior art example is that, in application to an optical measuring device, capacity of the current source for driving the laser is required to be large.

In the third prior art example, because the oscillation at the amplifying region is suppressed, it is not possible to increase current density such that, in order to increase light output, it is necessary to increase the length of the resonator or the width of the light output region. In the case of increasing the resonator length, because of increase in light loss at the amplifier region, the capacity of the current source for driving the laser is required to be as large as in the second prior art example. In the case of increasing the width of the light output region, the overall light emission region becomes large such that the optical system, for example, for an optical measuring device, inevitably becomes large.

SUMMARY OF THE INVENTION

It is an object of the present invention, therefore, to overcome the problems existing in the prior art and to provide a semiconductor laser in which electric/optical conversion efficiency is high, and which is capable of generating a large output from a narrow light output region.

According to a first aspect of the invention, there is provided a semiconductor laser having a laser gain region between a high reflection film and a low reflection film, the laser gain region having a width varying along a resonating direction and comprising:

an input region positioned at the high reflection film; and
an output region narrower than the input region and positioned at the low reflection film.

According to a second aspect of the invention, there is provided a semiconductor laser having a first conductivity type buffer layer, an active layer and a second conductivity type cladding layer which are sequentially positioned on a first conductivity type semiconductor substrate, the active layer having a laser gain region to which an electric current is injected, the laser gain region having a width varying linearly along a resonating direction, the laser gain region comprising:

a high reflection film provided on a facet of a wide side of the laser gain region of the active layer; and
a low reflection film provided on a facet of a narrow side of the laser gain region of the active layer, the facet of the narrow side being for outputting oscillation beams of a high-order mode.

In the semiconductor laser according to the first aspect of the invention, the semiconductor laser has a plurality of flared light emission regions which are arranged in an array form with their wide portions and narrow portions being positioned alternately adjacent to one another. The light outputted is the sum of the light from the flared light emission region at the center of the structure and the light from the narrow light emission region at the sides of the flared light emission region. Thus, the output obtained is large although the size increase in the total light emission regions compared with the flared light emission region in the center is very slight.

Also, in the flared structure type semiconductor laser in which an active waveguide is in a ridge type waveguide, there is provided a radiation mode inhibiting region which is formed by removing at least some parts of the active waveguide at side portions along the active waveguide of the ridge structure. With this, the radiation mode within the active waveguide is prevented and the electric/optical output conversion efficiency is enhanced.

In the semiconductor laser according to the second aspect of the invention, a semiconductor laser has a single flared light emission region and a highly reflective film is provided on the facet at the wide side of the active layer at which the current is injected.

The semiconductor laser according to this aspect of the invention may be in a composite form in which a plurality of the above described semiconductor lasers each including the light emission region may be laid one over another thereby forming a multilayer semiconductor layer.

BRIEF DESCRIPTION OF THE DRAWINGS

The above and other objects, features and advantages of the present invention will be apparent from the following description of preferred embodiments of the invention explained with reference to the accompanying drawings, in which:

FIG. 2 is a perspective view of a second prior art example of a structure which corresponds to that shown in FIG. 1C;

FIG. 3 is a plan view of the second prior art example shown in FIG. 2;

PREFERRED EMBODIMENTS OF THE INVENTION

Now, preferred embodiments of the invention are explained with reference to the drawings.

Figure 1A:
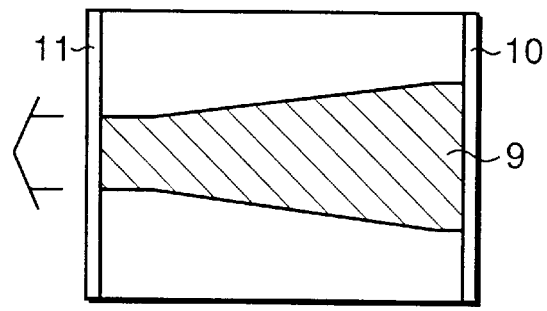
FIGS. 1A–1D are diagrams for showing general structural arrangements of light outputting elements, FIG. 1A showing those for an element according to the invention for purposes of comparison, and FIGS. 1B, 1C, and 1D showing those of prior art elements.
Figure 1B:
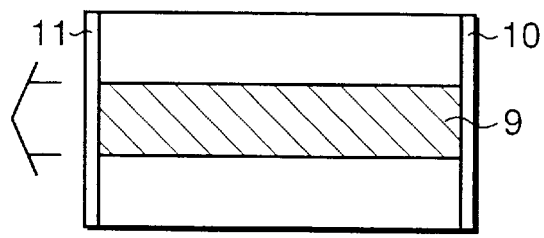
Figure 1C:
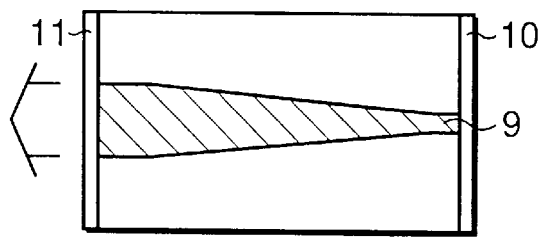
Figure 1D:
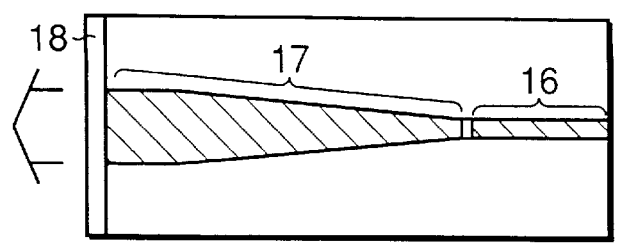
Figure 4:
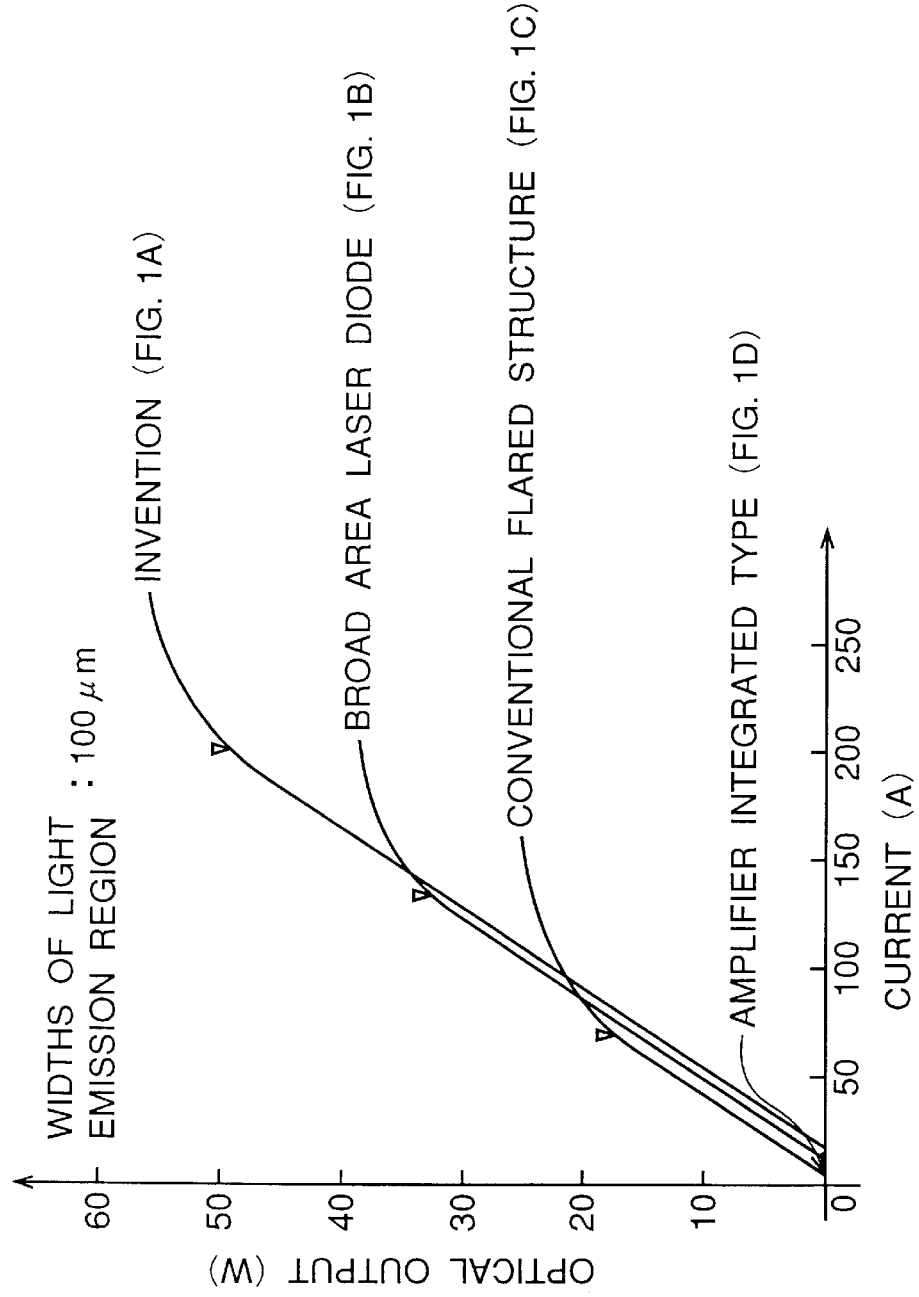
FIG. 4 is a graph showing electric current/optical output characteristics obtained in each of the structures shown in FIGS. 1A–1D.
Figure 5:
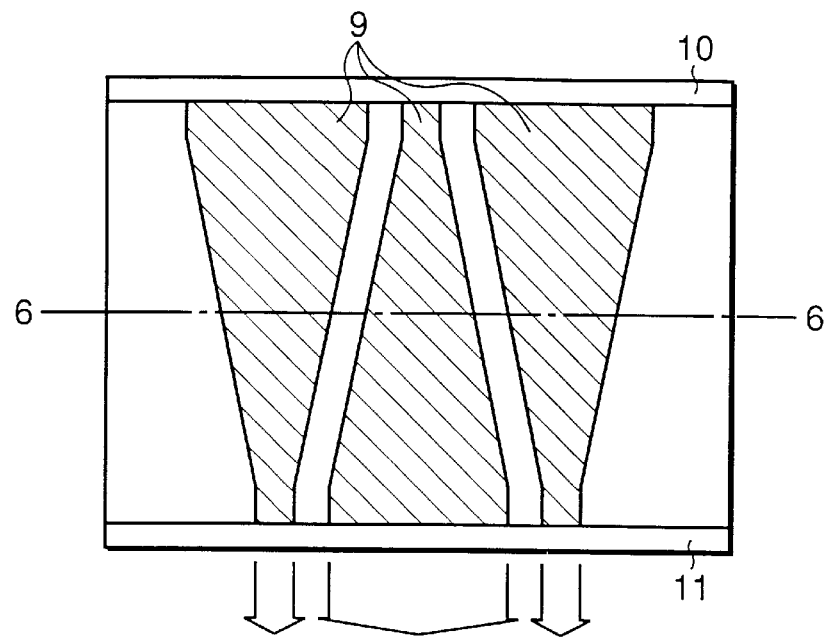
FIG. 5 is a plan view of an element of a flared structure type semiconductor laser of a first embodiment according to the invention.
Figure 6:
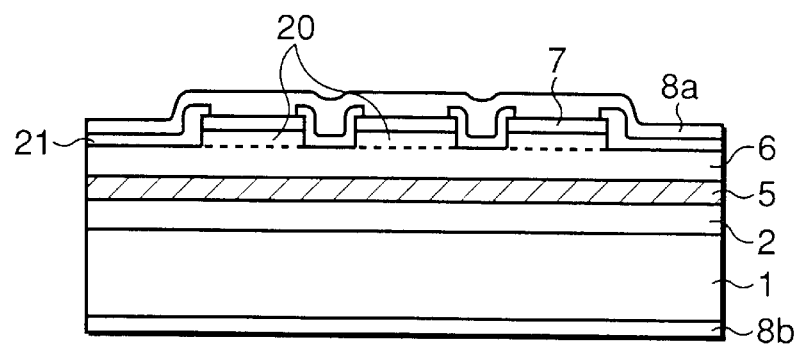
FIG. 6 is a sectional view of the element of FIG. 4, the section being taken along lines 6—6 in FIG. 5.
Figure 7:
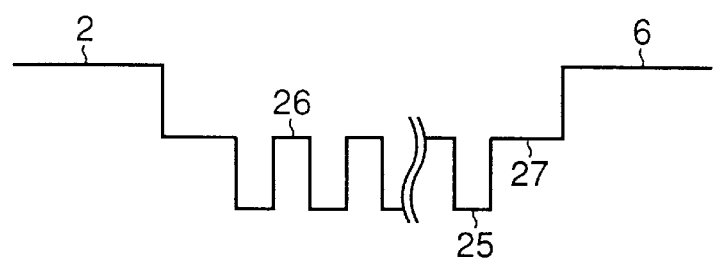
FIG. 7 is diagram showing energy bands in a multi-quantum well structure of an active layer.

FIG. 5 shows, in a plan view, the flared structure type semiconductor laser of a first embodiment according to the invention, and FIG. 6 shows a diagrammatic sectional view taken along lines 6—6 in FIG. 5. The element shown is fabricated as explained hereinafter. First, an n-InP buffer layer 2 (0.2 $\mu$m thick), an active layer 5, and a cladding layer 6 (0.3 $\mu$m thick) are sequentially formed on an n-InP substrate 1. The active layer 5 has a multi-quantum well structure with energy bands as shown in FIG. 7, and is constituted by five InGaAsP well layers 25 (8 nm thick) with a compressive strain of +0.8% being introduced, an InGaAsP barrier layer 26 (6 nm thick) with a composition having an emission wavelength of 1.2 $\mu$m, and an InGaAsP SCH (Separate Confinement Hetero-structure) layer 27 (50 nm thick) of a composition having an emission wave-length of 1.2 $\mu$m. The emission wavelength at the active layer 5 is 1.5 $\mu$m. After an SiO$_2$ insulating film is formed on a semiconductor wafer, tapered shapes are patterned with the widths varied longitudinally and arranged in an array form, and a p-InP ridge cladding layer 20 (2.5 $\mu$m thick) and a p-InGaAs contact layer 7 (0.5 $\mu$m thick) having an emission wavelength of 1.64 $\mu$m are selectively grown. The ridged waveguide structure is shaped such that its widths at the narrow region and the wide region are 4 $\mu$m and 100 $\mu$m, respectively, and its width varies from 4 $\mu$m to 100 $\mu$m along a length of 900 $\mu$m. The distance between the arrays is 10 $\mu$m. Then, an insulating film 21 is formed by removing an upper surface of the contact layer at the epitaxially grown layer side, and an n-side ohmic electrode 8b and a p-side ohmic electrode 8a are formed at the substrate side and the grown layer side, respectively. Finally, the resulting structure is cleaved into arrayed chips, and a highly reflective film 10 (reflectivity 90%) is formed on the facet of the side at which the total light emission width is large and a low reflective film 11 (reflectivity 10%) is formed on the facet of the side at which the total light emission width is narrow, whereby the flared structure type semiconductor laser desired is obtained. The total element length is 1 mm, and a linear waveguide of 50 $\mu$m is formed on each of two sides of the tapered region whose length is 90 $\mu$m.

In the above semiconductor laser, by applying a current having pulse width of 20 ns with a repetition rate of 10 kHz, a far-field emission image is obtained which is of single peak mode with peak output of up to 50 W, and has no ripples. The oscillation threshold current and slope efficiency were respectively 3 A and 0.25 W/A, and the total light emission width was 128 $\mu$m.

In the prior art broad area laser with a total light emission region of 128 $\mu$m, in an element having a resonator length of 1000 $\mu$m, the maximum light output was 33 W with slope efficiency of 0.25 W/A, so that the maximum light output according to this embodiment has been enhanced by more than 1.5 times. In an element having resonator length of 1500 $\mu$m, the maximum light output was 50 W with slope efficiency of 0.18 W/A, which means that the efficiency has been improved by 1.4 times.

Figure 8:
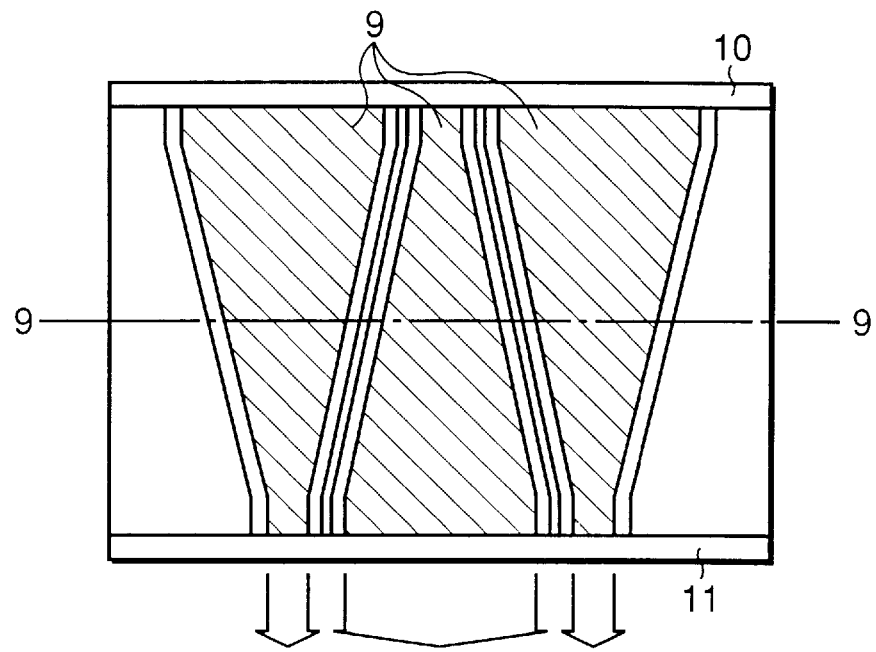
FIG. 8 is a plan view of an element of a flared structure type semiconductor laser of a second embodiment according to the invention.
Figure 9:
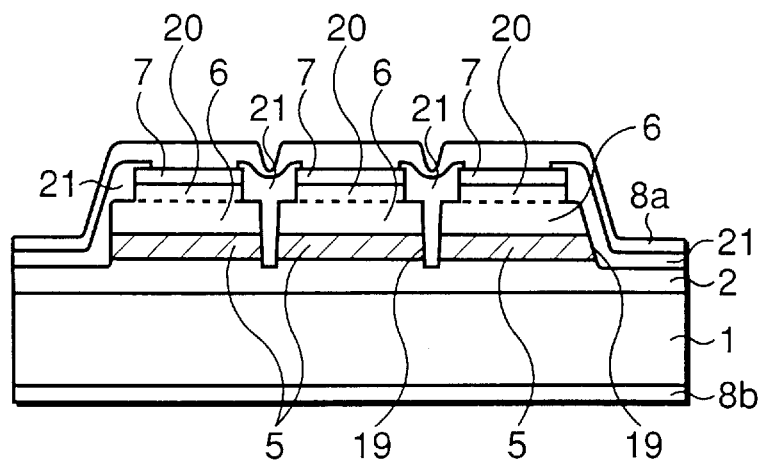
FIG. 9 is a sectional view of the element of FIG. 8, the section being taken along lines 9—9 in FIG. 8.

FIG. 8 shows, in a plan view, a flared structure type semiconductor laser of a second embodiment according to the invention, and FIG. 9 shows, in a diagrammatic sectional view, a section taken along lines 9—9 in FIG. 8. The element shown is fabricated as explained hereinafter. First, an n-InP buffer layer 2 (0.2 $\mu$m thick), an active layer 5, and a cladding layer 6 (0.3 $\mu$m thick) are sequentially formed on an n-InP substrate 1. The active layer 5 has a multi-quantum well structure with energy bands as shown in FIG. 7, and is constituted by five InGaAsP well layers 25 (8 nm thick) with a compressive strain of +0.8% being introduced, an InGaAsP barrier layer 26 (6 nm thick) with a composition having an emission wavelength of 1.2 $\mu$m, and an InGaAsP SCH layer 27 (50 nm thick) of a composition having an emission wavelength of 1.2 $\mu$m. The emission wavelength at the active layer 5 is 1.5 $\mu$m. After an SiO$_2$ insulating film is formed on a semiconductor wafer, tapered shapes are patterned with the widths varied longitudinally and arranged in an array form, and a p-InP ridge cladding layer 20 (2.5 $\mu$m thick) and a p-InGaAs contact layer 7 (0.5 $\mu$m thick) having an emission wavelength of 1.64 $\mu$m are selectively grown. The ridged waveguide structure is shaped such that its widths at the narrow region and the wide region are 4 $\mu$m and 100 $\mu$m, respectively, and its width varies from 4 $\mu$m to 100 $\mu$m along a length of 900 $\mu$m. The distance between the arrays is 25 $\mu$m. Thereafter, by leaving 10 $\mu$m of the ridge cladding layer 20 at each of its two side portions, etching is made through to the active layer 5. Then, an insulating film 21 is formed by removing an upper surface of the contact layer at the epitaxially grown layer side, and an n-side ohmic electrode 8b and a p-side ohmic electrode 8a are formed at the substrate side and the grown layer side, respectively. Finally, the resulting structure is cleaved into arrayed chips, and a highly reflective film 10 (reflectivity 90%) is formed on the facet of the side at which the total light emission width is large, and a low reflective film 11 (reflectivity 10%) is formed on the facet of the side at which the total light emission width is narrow, whereby the flared structure type semiconductor laser desired is obtained. The total element length is 1 mm, and a linear waveguide of 50 $\mu$m is formed on each of the two sides of the tapered region whose length is 900 $\mu$m.

In the example shown in FIG. 9, the cut portions serve as radiation mode inhibiting regions 19.

In the above semiconductor laser, by applying a current having a pulse width of 20 ns with a repetition rate of 10 kHz, a far-field emission image is obtained which is of single peak mode with peak output of up to 50 W, and has no ripples. The oscillation threshold current and slope efficiency were respectively 3 A and 0.25 W/A, and the total light emission width was 158 μm.

Figure 10:
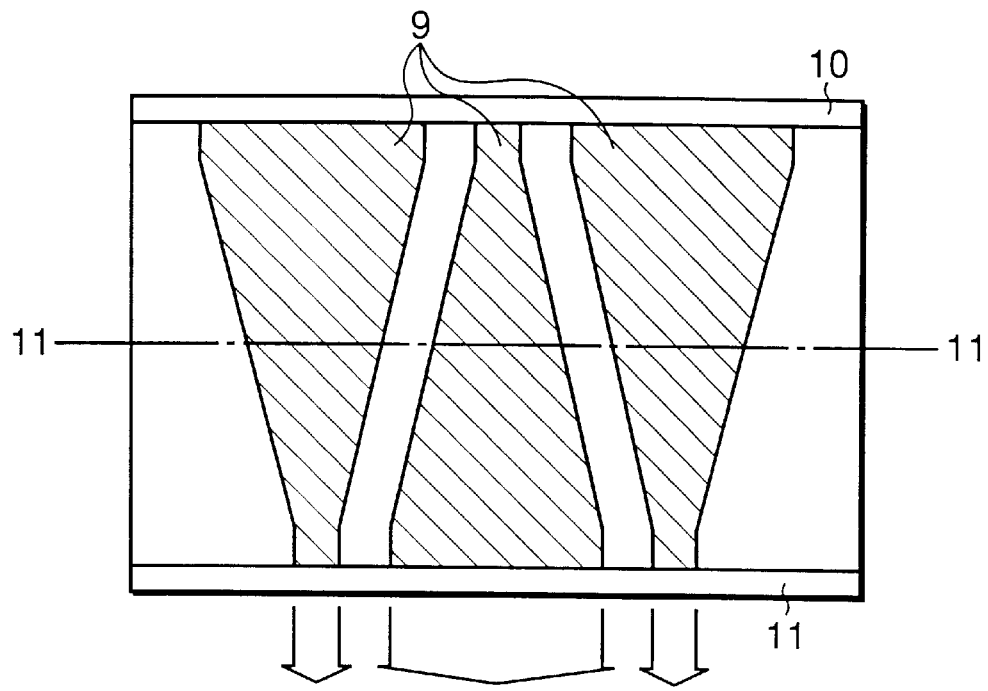
FIG. 10 is a plan view of an element of a flared structure type semiconductor laser of a third embodiment according to the invention.
Figure 11:
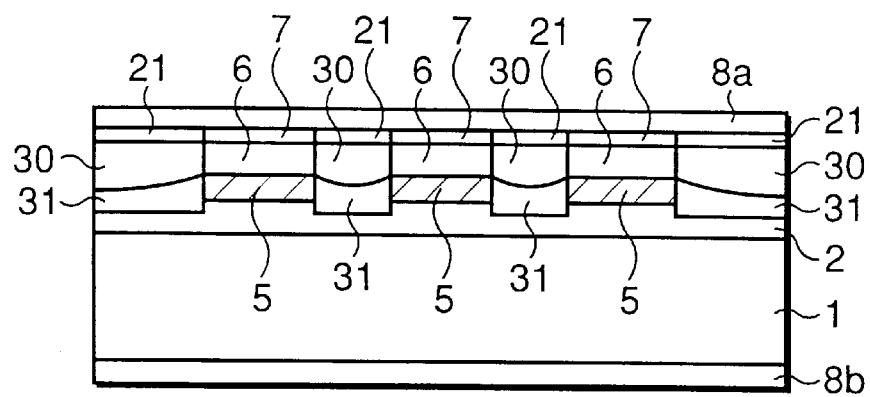
FIG. 11 is a sectional view of the element of FIG. 10, the section being taken along lines 11—11 in FIG. 10.

FIG. 10 shows, in a plan view, a flared structure type semiconductor laser of a third embodiment according to the invention, and FIG. 11 shows, in a diagrammatic sectional view, a section taken along lines 11—11 in FIG. 10. The element shown is fabricated as explained hereinafter. First, an n-InP buffer layer 2 (0.2 μm thick), an active layer 5, a cladding layer 6 (2 μm thick), and a p-InGaAs contact layer 7 (0.5 μm thick) having an emission wavelength of 1.64 μm are sequentially formed on an n-InP substrate 1. The active layer 5 has a multi-quantum well structure with energy bands as shown in FIG. 7, and is constituted by five InGaAsP well layers 25 (8 nm thick) with a compressive strain of +0.8% being introduced, an InGaAsP barrier layer 26 (6 nm thick) with a composition having an emission wavelength of 1.2 μm, and an InGaAsP SCH layer 27 (50 nm thick) of a composition having an emission wavelength of 1.2 μm. The emission wavelength of the active layer 5 is 1.5 μm. After an SiO$_2$ insulating film is formed on a semiconductor wafer, tapered shapes are patterned with the widths varied longitudinally and arranged in an array form, and an SiO$_2$ etching mask is formed. The tapered waveguide structure is shaped such that its widths at the narrow region and the wide region are 4 μm and 100 μm, respectively, and its width varies from 4 μm to 100 μm along the length of 900 μm. The distance between the arrays is 25 μm. Thereafter, the outside regions of the tapered mask are etched through to the active layer 5, and a p-type InP layer 31 and an n-type Inp layer 30 are buried by regrowth. Then, the SiO$_2$ etching mask is removed, and an insulating film 21 is formed by removing an upper surface of the contact layer at the epitaxially grown layer side. Further, an n-side ohmic electrode 8b and a p-side ohmic electrode 8a are formed at the substrate side and the grown layer side, respectively. Finally, the resulting structure is cleaved into arrayed chips, and a highly reflective film 10 (reflectivity 90%) is formed on the facet of the side at which the total light emission width is large and a low reflective film 11 (reflectivity 10%) is formed on the facet of the side at which the total light emission width is narrow, whereby the flared structure type semiconductor laser desired is obtained. The total element length is 1 mm, and a linear waveguide of 50 μm is formed on each side of the tapered region whose length is 900 μm.

In the above semiconductor laser, by applying a current having a pulse width of 20 ns with a repetition rate of 10 kHz, a far-field emission image is obtained which is of single peak mode with peak output of up to 50 W, and has no ripples. The oscillation threshold current and the slope efficiency were respectively 3 A and 0.25 W/A, and the total light emission width was 158 μm.

Figure 12:
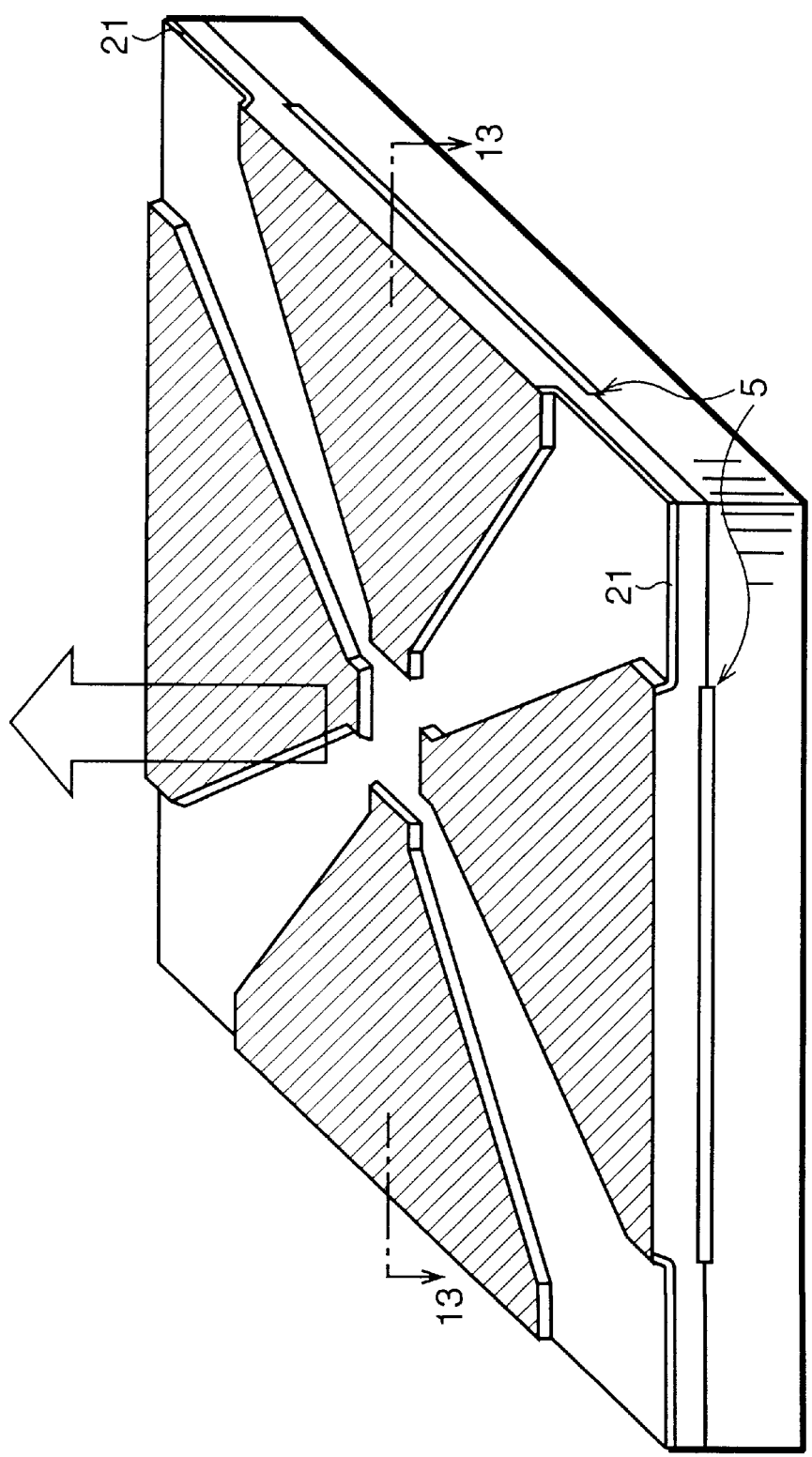
FIG. 12 is a perspective view of an element of a flared structure type semiconductor laser of a fourth embodiment according to the invention.
Figure 13:
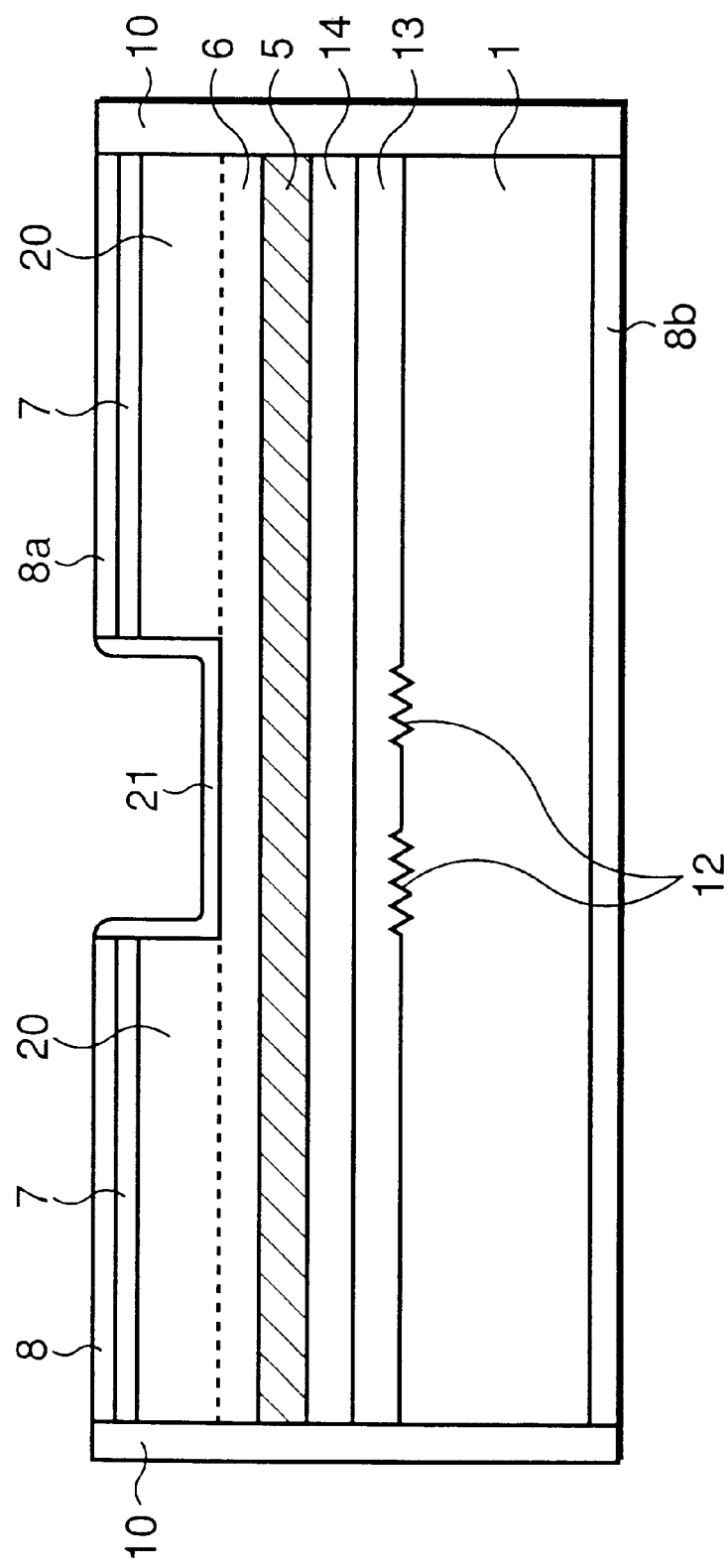
FIG. 13 is a sectional view of the element of FIG. 12, the section being taken along lines 13—13 in FIG. 12.

FIG. 12 shows, in a plan view, a flared structure type semiconductor laser of a fourth embodiment according to the invention, and FIG. 13 shows in a diagrammatic sectional view, a section taken along lines 13—13 in FIG. 12. The element shown is fabricated as explained hereinafter. First, a second-order diffraction grating 12 is formed on an n-InP substrate 1, and an InGaAsP optical guide layer 13 (0.1 μm thick) with a composition having an emission wavelength of 1.2 μm, an n-InP spacer layer 14 (40 nm thick), an active layer 5, a cladding layer 6 (0.3 μm thick) are sequentially grown. The active layer 5 has a multi-quantum well structure with energy bands as shown in FIG. 7, and is constituted by five InGaAsP well layers 25 (8 nm thick) with a compressive strain of +0.8% being introduced, an InGaAsP barrier layer 26 (6 nm thick) with a composition having an emission wavelength of 1.2 μm, and an InGaAsP SCH layer 27 (50 nm thick) of a composition having an emission wavelength of 1.2 μm. The emission wavelength of the active layer 5 is 1.5 μm. After an SiO$_2$ insulating film is formed on a semiconductor wafer, tapered shapes are patterned with the widths varied longitudinally and arranged in an array form, and a p-InP ridge cladding layer 20 (2.5 μm thick) and a p-InGaAs contact layer 7 (0.5 μm thick) having an emission wavelength of 1.64 μm are selectively grown. The ridged waveguide structure is shaped such that the narrow region and wide region thereof respectively are 4 μm and 100 μm wide, and thus the width varies from 4 μm to 100 μm along a length of 900 μm.

Thereafter, an insulating film 21 is formed by removing an upper surface of the contract layer at the epitaxially grown layer side, and an n-side ohmic electrode 8b and a p-side ohmic electrode 8a are formed at the substrate side and the grown layer side, respectively. Finally, the resulting structure is cleaved into arrayed laser chips, and a highly reflective film 10 (reflectivity 90%) is formed on the facet, thereby the flared structure type semiconductor laser desired is obtained. The total length of the individual element is 1 mm, and a linear waveguide of 50 μm is formed on each of the two sides of the tapered region whose length is 900 μm. The light is outputted in the direction vertical to the substrate 1. The light output region of the individual element is 4 μm×20 μm such that, within the region of 50 μm×50 μm, four elements are integrated so as to accommodate four light output regions.

In the above semiconductor laser, by applying a current having a pulse width of 20 ns with a repetition rate of 10 kHz, the output obtained was a far-field emission image of single peak mode with peak output of up to 70 W without ripples. The oscillation threshold current and the slope efficiency were respectively 4 A and 0.25 W/A.

Figure 14:
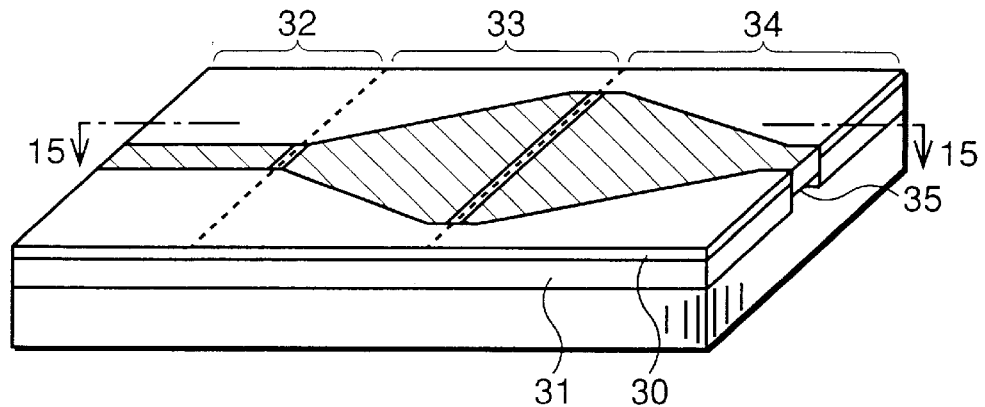
FIG. 14 is a perspective view of an element of a flared structure type semiconductor laser of a fifth embodiment according to the invention.
Figure 15:
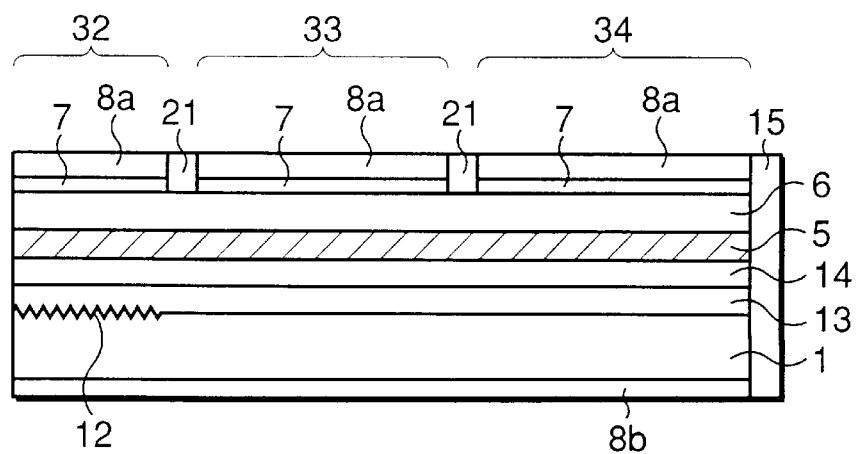
FIG. 15 is a sectional view of the element of FIG. 14, the section being taken along lines 15—15 in FIG. 14.

FIG. 14 shows, in a plan view, the flared structure type semiconductor laser of a fifth embodiment according to the invention, and FIG. 15 shows, in a diagrammatic sectional view, a section taken along lines 15—15 in FIG. 14. The element shown is fabricated as explained hereinafter. First, a first-order diffraction grating 12 is formed on an n-InP substrate 1, and an InGaAsP optical guide layer 13 (0.1 μm thick) with a composition having an emission wavelength of 1.2 μm, an n-InP spacer layer 14 (40 nm thick), an active layer 5, a cladding layer 6 (2 μm thick) and a p-InGaAs contact layer 7 (0.5 μm thick) having an emission wavelength of 1.64 μm are sequentially grown. The active layer 5 has a multi-quantum well structure with energy bands as shown in FIG. 7, and is constituted by five InGaAsP well layers 25 (8 nm thick) with a compressive strain of +0.8% being introduced, an InGaAsP barrier layer 26 (6 nm thick) with a composition having an emission wavelength of 1.2 μm, and an InGaAsP SCH layer 27 (50 nm thick) of a composition having an emission wavelength of 1.2 μm. The emission wavelength of the active layer 5 is 1.5 μm. Thereafter the portion other than DFB laser 32, optical amplifier 33 and spot size converter 34 are selectively removed to the active layer 5, and a p-type InP layer 31, and an n-type InP layer 30 are buried by regrowth. Then, an insulating film 21 is formed on surfaces of the contact layer 7 on the p side and the n-type InP buried regrown layer 30, and the regions of the DFB laser 32, the optical amplifier 33 and the spot size converter 34 are respectively removed by etching. Next, the electrode 8a at the p-side is formed with the electrode being divided. The substrate at the n-side is polished and, after the thickness thereof is reduced to about 100 μm, the electrode 8b at the n side is formed. Finally, a low reflective film 11 is formed on the facet at the light output side, and the structure is cleaved into chips.

In the laser according to this fifth embodiment, the width and length of the DFB laser 32 are respectively 2 μm and 500 μm, the length of the optical amplifier 33 is 2000 μm, the width of the connecting portion connected to the DFB laser 32 is 2 μm, and the width of the connecting portion connected to the spot size converter 34 is 200 μm. The length of the spot size converter is 2000 μm, and the width of the light output region is 2 μm.

Now, the operation of the semiconductor laser according to the fifth embodiment is explained.

When the direct current in the forward direction is applied independently to each of the DFB laser 32, the optical amplifier 33 and the spot size converter 34, laser beams are generated at the DFB laser 32, and the optical amplifier 33 amplifies the light intensity and enlarges the spot sizes thereof. Then, at the spot size converter 34, the spot sizes are reduced in such a manner that the intensity of the amplified laser beams are not lowered, whereby a large output is obtained at the light output region 35. By applying current of 300 mA, 20 A and 2 A respectively to the DFB laser 32, optical amplifier 33 and spot size converter 34, the output obtained with light emission region width of 2 μm was a far-field emission image of single peak mode with peak output of up to 10 W, without ripples.

Figure 16:
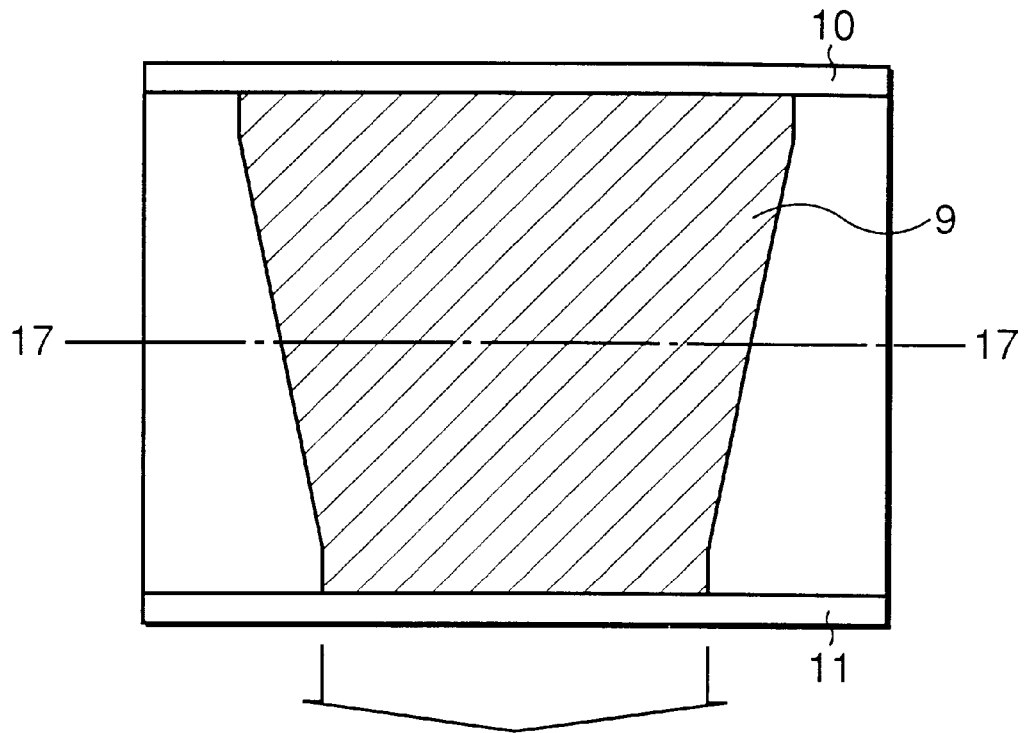
FIG. 16 is a plan view of an element of a flared structure type semiconductor laser of a sixth embodiment according to the invention.
Figure 17:
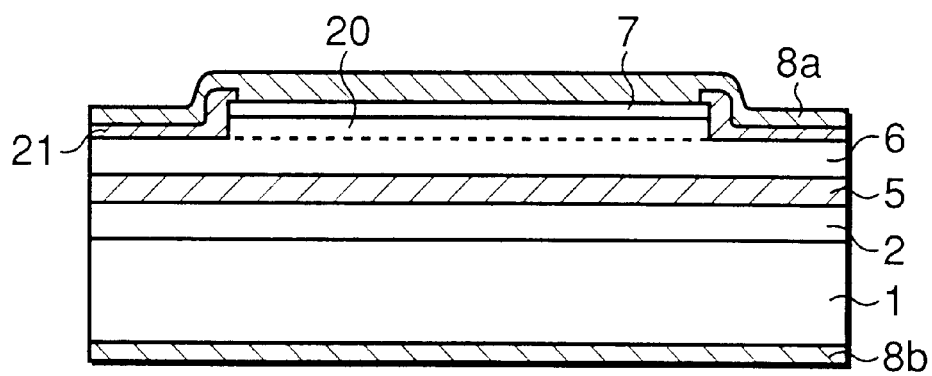
FIG. 17 is a sectional view of the element of FIG. 16, the section being taken along lines 17—17 in FIG. 16.

FIG. 16 shows, in a plan view, a flared structure type semiconductor laser of a sixth embodiment according to the invention, and FIG. 17 shows in a diagrammatic sectional view, a section taken along lines 17—17 in FIG. 16. The element shown is fabricated as explained hereinafter. First, an n-InP buffer layer 2 (0.2 μm thick), an active layer 5, and a p-InP cladding layer 6 (0.3 μm thick) are sequentially grown on an n-InP substrate 1. The active layer 5 has a multi-quantum well structure with energy bands as shown in FIG. 7, and is constituted by five InGaAsP well layers 25 (8 nm thick) with a compressive strain of +0.8% being introduced, an InGaAsP barrier layer 26 (6 nm thick) with a composition having an emission wavelength of 1.2 μm, and an InGaAsP SCH layer 27 (50 nm thick) of a composition having an emission wavelength of 1.2 μm. The emission wavelength of the active layer 5 is 1.5 μm.

After an SiO$_2$ insulating film is formed on a semiconductor wafer, an opening with widths varied longitudinally is formed, and a p-InP ridge cladding layer 20 (2.5 μm thick) and a p-InGaAs contact layer 7 (0.5 μm thick) having an emission wavelength of 1.64 μm are selectively grown. The ridged waveguide structure is shaped such that the narrow region and wide region thereof respectively are 100 μm and 200 μm wide and thus the width varies linearly along a length of 900 μm. Thereafter, the insulating film 21 is formed on the epitaxially grown layer and, after a window is opened in the contact layer 7, a p-side electrode 8a and an n-side electrode 8b are respectively formed on the contact layer 7 and at the back surface of the substrate.

Finally, the resulting structure is cleaved into laser chips, and a highly reflective film 10 (reflectivity 90%) is formed on the facet at the wide side of the light emission region and a low reflective film 11 (reflectivity 10%) is formed on the facet at the narrow side of the light emission region is formed, whereby a flared structure type laser is obtained. The linear waveguide of 50 μm is formed at each of the two sides of the tapered region along the length of 900 μm, and the entire length of the element is 1000 μm.

In the above semiconductor laser, by applying a current having a pulse width of 20 ns with a repetition rate of 10 kHz, a far-field emission image in the horizontal direction is obtained which is of single peak mode with full width half maximum of 20° and peak output of up to 50 W, and has no ripples. The oscillation threshold current and the slope efficiency were respectively 3 A and 0.25 W/A, and the total light emission width at the light output region was 100 μm.

In the prior art broad area laser with the light emission region of 100 μm, in an element having a resonator length of 1000 μm, the maximum light output was 33 W with slope efficiency of 0.25 W/A, such that the maximum light output according to this embodiment has been enhanced by more than 1.5 times. In an element having a resonator length of 1500 μm, the maximum light output was 50 W with slope efficiency of 0.18 W/A, which means that the efficiency has been improved by 1.4 times.

Figure 18:
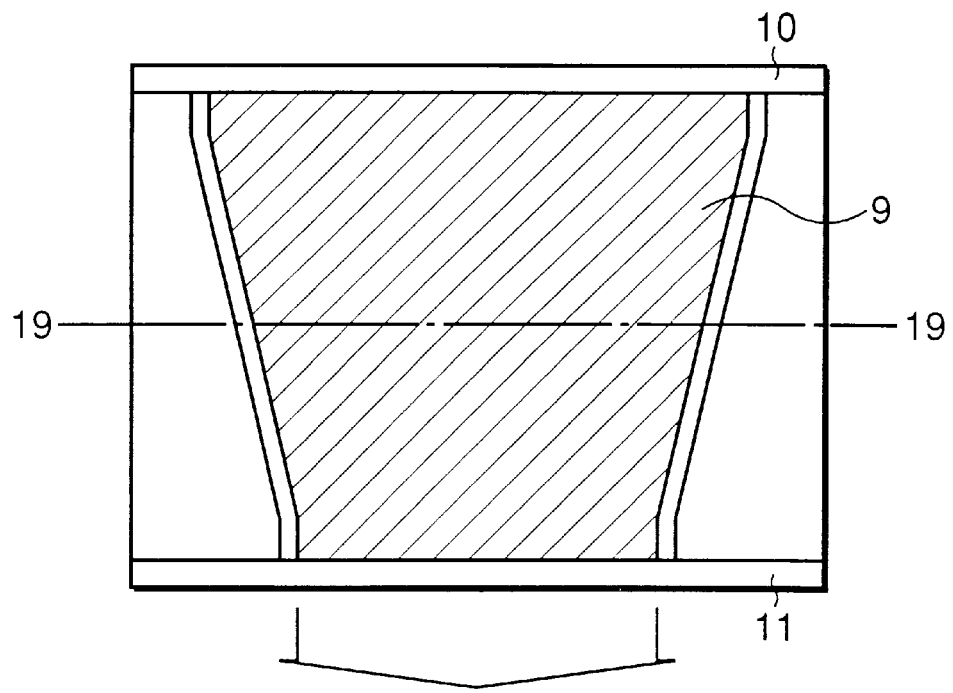
FIG. 18 is a plan view of an element of a flared structure type semiconductor laser of a seventh embodiment according to the invention.
Figure 19:
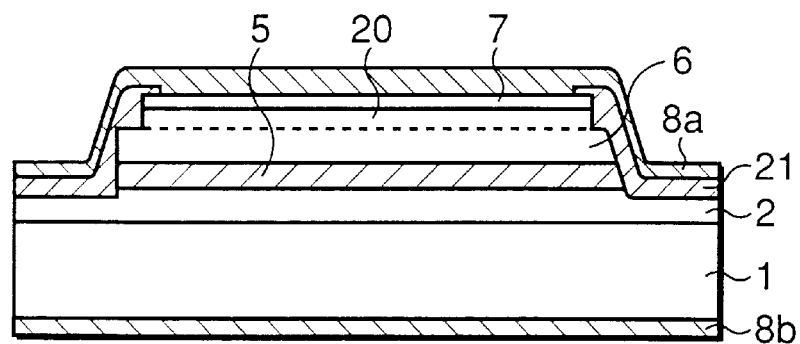
FIG. 19 is a sectional view of the element of FIG. 18, the section being taken along lines 19—19 in FIG. 18.

FIG. 18 shows, in a plan view, a flared structure type semiconductor laser of a seventh embodiment according to the invention, and FIG. 19 shows, in a diagrammatic sectional view, a section taken along lines 19—19 in FIG. 18. The element shown is fabricated as explained hereinafter. First, an n-InP buffer layer 2 (0.2 μm thick), an active layer 5, and a p-InP cladding layer 6 (0.3 μm thick) are sequentially grown on an n-InP substrate 1. The active layer 5 has the same SCH multi-quantum well structure as in the above sixth embodiment and the energy bands therein are as shown in FIG. 7.

After the SiO$_2$ insulating film is formed on the wafer prepared as above, an opening having varied width longitudinally of the resonator is formed, and in this opening a p-InP ridge cladding layer 20 (2.5 μm thick) and a p-InGaAs contact layer 7 (0.5 μm thick) having an emission wavelength of 1.64 μm are sequentially grown. The widths of the narrow region and the wide region of the ridge waveguide structure are respectively 100 μm and 200 μm, with variation of the widths being linear throughout a length of 900 82 m. Then, the p-InP cladding layer 6 and the active layer 5 are etched away leaving 10 μm thereof at each of the two side regions of the ridged cladding layer 20.

Thereafter, the insulating film 21 is formed on the epitaxially grown layer and, after a window is opened in the contact layer 7, a p-side electrode 8a and an n-side electrode 8b are respectively formed on the contact layer 7 and at the back surface of the substrate. Finally, the resulting structure is cleaved into laser chips, and a highly reflective film 10 (reflectivity 90%) is formed on the facet of the side at which the light emission width is large and a low reflective film 11 (reflectivity 10%) is formed on the facet of the side at which the light emission width is narrow, whereby the flared structure type semiconductor laser desired is obtained. The linear waveguide of 50 μm is formed at each of the two sides of the tapered region along the length of 900 μm, and the entire length of the element is 1000 μm.

In the above semiconductor laser, by applying a current having a pulse width of 20 ns with a repetition rate of 10 kHz, a far-field emission image in the horizontal direction is obtained which is of single peak mode with full width half maximum of 20° and peak output of up to 50 W, and has no ripples. The oscillation threshold current and slope efficiency were respectively 3 A and 0.25 W/A, and total light emission width at the light output region was 100 μm.

Figure 20:
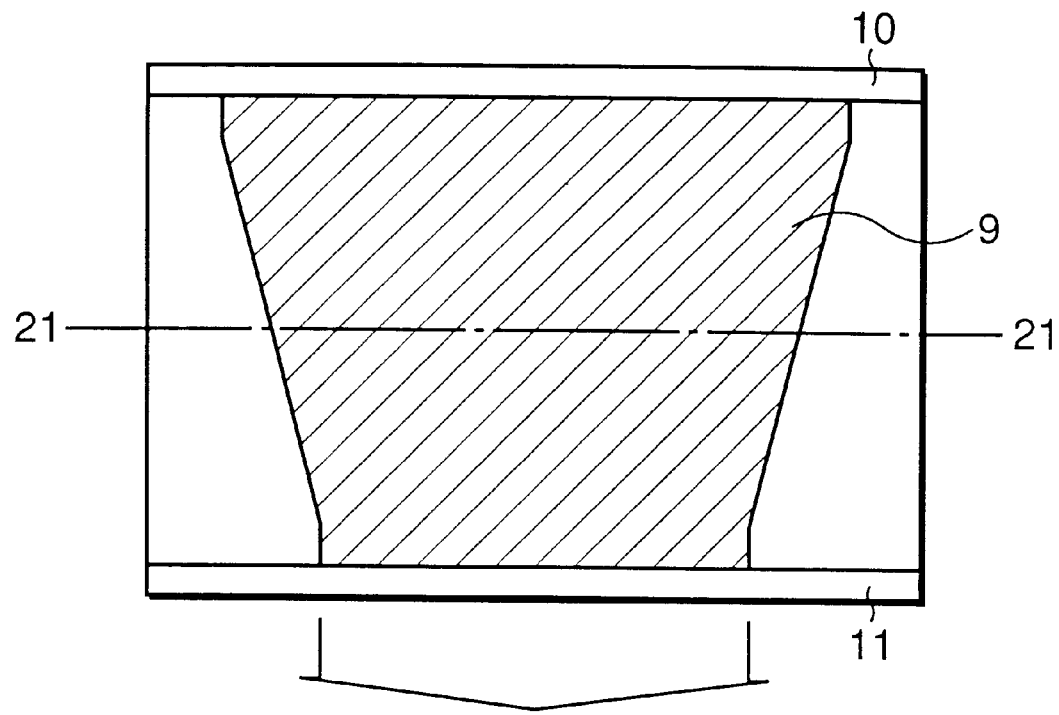
FIG. 20 is a plan view of an element of a flared structure type semiconductor laser of an eighth embodiment according to the invention.
Figure 21:
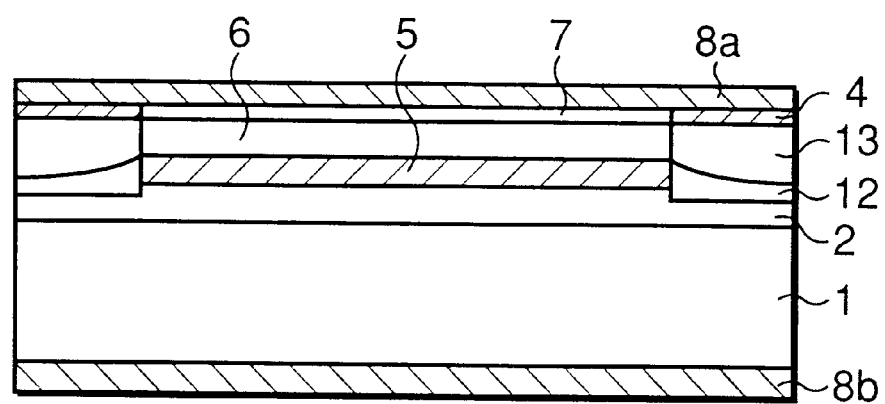
FIG. 21 is a sectional view of the element of FIG. 20, the section being taken along lines 21—21 in FIG. 20.

FIG. 20 shows, in a plan view, a flared structure type semiconductor laser of an eighth embodiment according to the invention, and FIG. 21 shows, in a diagrammatic sectional view, a section taken along lines 21—21 in FIG. 20. The element shown is fabricated as explained hereinafter. First, an n-InP buffer layer 2 (0.2 μm thick), an active layer 5, a p-InP cladding layer 6 (2 μm thick) and a contact layer 7 (0.5 μm thick) having an emission wavelength of 1.64 μm are sequentially grown on an n-InP substrate 1. The active layer 5 has a multi-quantum well structure with energy bands as shown in FIG. 7, and is constituted by the same SCH multi-quantum well structure as in the above sixth embodiment.

Next, an $SiO_2$ insulating film is formed on the wafer, and is processed so as to form an $SiO_2$ mask having a tapered pattern with its width varying longitudinally of the resonator. The widths of the narrow region and the wide region of the ridge waveguide structure are respectively 100 μm and 200 μm with variation of the widths being linear throughout a length of 900 μm.

Thereafter, outside regions of the tapered mask are removed by etching, and in each of these removed regions a p-InP buried layer 12 and an n-Inp buried layer 13 are grown. Then, the $SiO_2$ etching mask is removed, and an insulating film 21 is formed on the epitaxially grown layer. Further, a window is opened on the contact layer 7, and a p-side electrode 8a is formed on the contact layer 7 while an n-side electrode 8b is formed on the back surface of the substrate.

Finally, the resulting structure is cleaved into laser chips, and a highly reflective film 10 (reflectivity 90%) is formed on the facet at the wide side of the light emission region and a low reflective film 11 (reflectivity 10%) is formed on the facet at the narrow side of the light emission region is formed, whereby a flared structure type laser is obtained. The linear waveguide of 50 μm is formed at each of the two sides of the tapered region along the length of 900 μm, and the entire length of the element is 1000 μm.

In the above semiconductor laser, by applying a current having pulse width of 20 ns with a repetition rate of 10 kHz, a far-field emission image in the horizontal direction is obtained which is of single peak mode with full width half maximum is 20° and peak output is up to 50 W, and has no ripples. The oscillation threshold current and the slope efficiency were respectively 3 A and 0.25 W/A, and the total light emission width at the light output region was 100 μm.

Figure 22:
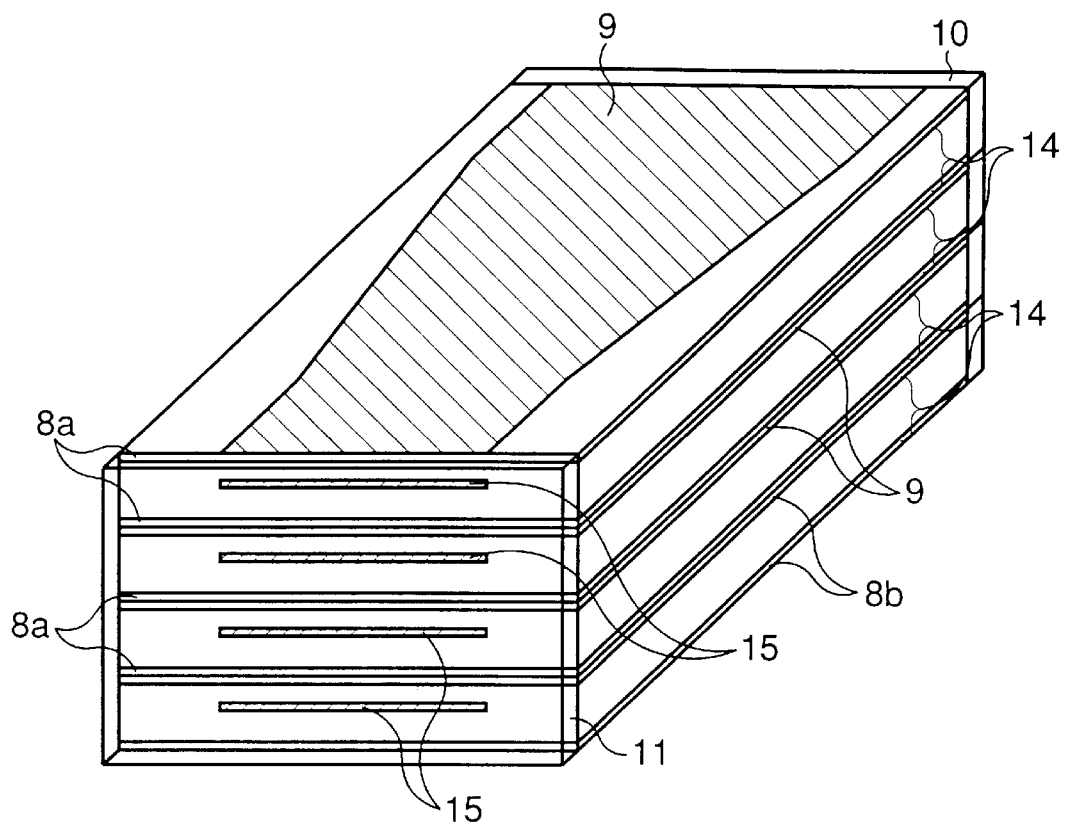
FIG. 22 is a perspective view of a composite semiconductor laser according to a ninth embodiment of the invention.

FIG. 22 shows, in a diagrammatic perspective view, a composite semiconductor laser of a ninth embodiment according to the invention, in which four flared structure type semiconductor lasers 14 according to any of the embodiments 6 to 8 are stacked one over another and electrically connected in series. The flared structure type semiconductor lasers 14 are p-n diodes. In each of these lasers 14, individual flared structure type lasers are placed in such a manner that the p-side electrodes 8a (or the n-side electrodes 8b) are at an upper position and the light output regions 15 are substantially aligned in the direction in which they are stacked. They are then bonded together and electrically connected in series by using a conductive bonding agent. The thickness of an individual flared structure type laser 14 is about 50 μm so that this embodiment enables fabrication of a semiconductor laser whose area of total light output region is smaller as compared with that in any of the prior art semiconductor lasers.

In the above semiconductor laser, by applying a current having pulse width of 20 ns with a repetition rate of 10 kHz, a far-field emission image in the horizontal direction is obtained which is of single peak mode with full width half maximum of 20° and peak output of up to 200 W, and has no ripples. The oscillation threshold current and slope efficiency were respectively 3 A and 1 W/A, and light output region 15 was 100 μm×150 μm.

While the invention has been described in its preferred embodiments, it is to be understood that the words which have been used are words of description rather than limitation and that changes within the purview of the appended claims may be made without departing from the true scope of the invention as defined by the claims. For example, in describing the embodiments, the material of the substrate for the element is shown as InP with the wavelength being in the vicinity of 1.5 μm, but the material to be used is not limited thereto as it is possible to use various other types of materials such as GaAs or InGaAlAs for appropriate wavelengths. Also, for constricting currents, a current blocking layer may well be built in the related semiconductor layers.

What is claimed is:

1. A semiconductor laser comprising a first conductivity type buffer layer and an active layer, said active layer being formed of one of two structures, one of said two structures being a multi-quantum well structure and the other of said two structures sandwiched by SCH layers being a multi-quantum well structure and a second conductivity type cladding layer, said active layer and said second conductivity type cladding layer being sequentially positioned on a first conductivity type semiconductor substrate, at least said active layer and said second conductivity type cladding layer being in a tapered ridge shape such that a width of said active layer is defined by said ridge shape, said width of said active layer varying linearly along a resonating direction, said tapered ridge shape defining a laser gain region comprising:

a relatively high reflection film provided on a facet of a relatively wide side of said laser gain region of the active layer; and a relatively low reflection film provided on a facet of a relatively narrow side of said laser gain region of the active layer, said facet of the narrow side being for outputting oscillation beams of a high-order mode.

2. The semiconductor laser according to claim 1, in which said second conductivity type cladding layer and said active layer are in a ridge structure in which side portions of said ridge structure form radiation mode inhibiting regions.

3. The semiconductor laser according to claim 1, in which said second conductivity type cladding layer is in a ridge structure whose planar shape substantially corresponds with a pattern of said laser gain region of the active layer.

4. The semiconductor laser according to claim 1, and comprising a radiation mode inhibiting region in which said active layer and said second conductivity type cladding layer are removed at side portions along said ridge structure whereby to expose portions of both side surfaces thereof which are covered by an insulating film.

5. A composite semiconductor laser comprising a plurality of lasers, stacked one upon another, each having a first conductivity type buffer layer and an active layer, said active layer being formed of one of two structures, one of said two structures being a multi-quantum well structure and the other of said two structures sandwiched by SCH layers being a multi-quantum well structure and a second conductivity type cladding layer which are sequentially formed on a first conductivity type semiconductor substrate, at least said active layer and said second conductivity type cladding layer being in a tapered ridge shape such that a width of said active layer is defined by said ridge shape, said active layer having a laser gain region whose width varies linearly along a resonating direction, said laser gain region comprising:

a relatively high reflection film provided on a facet of a relatively wide side of said laser gain region of the active layer; and a relatively low reflection film provided on a facet of a relatively narrow side of said laser gain region of the active layer, said facet of the narrow side being for outputting oscillated beams of a high-order mode.

* * * * *